United States Patent [19]

Harrington, III

[11] Patent Number: 5,159,426
[45] Date of Patent: Oct. 27, 1992

[54] INTEGRATED CIRCUIT WITH IMPROVED BATTERY PROTECTION

[75] Inventor: Thomas E. Harrington, III, Carrollton, Tex.

[73] Assignee: Dallas Semiconductor Corporation, Dallas, Tex.

[21] Appl. No.: 632,223

[22] Filed: Dec. 20, 1990

Related U.S. Application Data

[63] Continuation of Ser. No. 344,734, Apr. 28, 1989, Pat. No. 4,980,746, and a continuation-in-part of Ser. No. 187,864, Apr. 29, 1988, Pat. No. 4,862,310.

[51] Int. Cl.⁵ .............................................. H01L 27/02
[52] U.S. Cl. .................................. 357/42; 357/23.13; 357/48
[58] Field of Search ................... 357/23.13, 42, 48; 307/66

[56] References Cited

U.S. PATENT DOCUMENTS

| | | | |
|---|---|---|---|
| 4,631,567 | 12/1986 | Kokado et al. | 357/23.13 |
| 4,713,555 | 12/1987 | Lee | 307/66 |
| 4,857,985 | 8/1989 | Miller | 357/48 |
| 4,862,310 | 8/1989 | Harrington, III | 357/48 |
| 4,980,746 | 12/1990 | Harrington, III | 357/42 |

FOREIGN PATENT DOCUMENTS

| | | | |
|---|---|---|---|
| 61-110393 | 5/1986 | Japan | 357/48 |
| 62-125659 | 6/1987 | Japan | 357/48 |
| 63-190374 | 8/1988 | Japan | 357/48 |

*Primary Examiner*—Rolf Hille
*Assistant Examiner*—Steven Loke
*Attorney, Agent, or Firm*—Worsham, Forsythe, Sampels & Wooldridge

[57] ABSTRACT

A battery-backed integrated circuit, which receives battery power to maintain data (or logic states) when the system (external) power supply goes down. The battery power input is connected through a diode, so that the battery cannot be charged when the system power supply is active. The battery isolation diode is a junction diode, which is surrounded by a second junction. The battery junction collects minority carriers which will be generated when the battery protection diode is forward biased (i.e. when the integrated circuit is being powered from the battery). Otherwise, minority carriers can diffuse to other junctions, to cause leakage currents which can significantly degrade the lifetime of a low-powered device.

9 Claims, 5 Drawing Sheets

INTEGRATED CIRCUIT WITH IMPROVED BATTERY PROTECTION

CROSS-REFERENCE TO RELATED APPLICATION

This is a continuation of application Ser. No. 344,734, filed Apr. 28, 1989, now U.S. Pat. No. 4,980,746, which is a continuation-in-part of Ser. No. 187,804, filed Apr. 29, 1988, U.S. Pat. No. 4,862,310.

BACKGROUND AND SUMMARY OF THE INVENTION

The present invention pertains in general to battery-backed integrated circuits, and particularly to CMOS battery-backed integrated circuits and to circuits therein which prevent battery leakage due to parasitic PNP transistors.

Recent years have seen an increased use of integrated circuits which are "nonvolatized" by providing a small power supply to maintain their data state. Such arrangements have many advantages, including cost and compatibility. For example, the battery-backed memories available from Dallas Semiconductor typically include an SRAM and a tiny lithium battery in a single module, which has standard DIP pinout. If the external (system) power supply fails, the battery will provide enough voltage to retain data in the memory until system power is restored. Such a nonvolatized memory module will typically be cheaper per bit than an EEPROM module, and will have the further advantage of 100% compatibility with the functional specifications of a standard SRAM. For example, EEPROMs are very slow to write. Such nonvolatizing techniques have also been used to provide power-fault survivability in microprocessors, clock/calendars, and other types of integrated circuits.

In battery-backed systems, the battery voltage is typically lower than the operating supply voltage. For example, the battery voltage may be approximately three volts, whereas the operating voltage is five volts. In order to prevent current from the power supply flowing into the battery and thus charging the battery, a PN diode is utilized that is reverse biased in the normal operating mode. When non-rechargeable batteries (such as lithium batteries) are used, battery charging may damage the batteries.

Such a battery protection diode is typically realized with a P-well formed in an N-type substrate. The battery is connected to the P-well, so that it can source current to the N-type substrate when the operating supply voltage is not connected. The N-type substrate is then operable to be connected to the operating supply voltage that is higher than the battery voltage. Thus, when the operating supply voltage is connected, the diode is reverse biased.

One problem that occurs in the diode protection system is caused by the action of a parasitic PNP transistor when the battery is sourcing current. This parasitic PNP transistor is formed by an adjacent P-well device in the N-type substrate that is connected to a voltage lower than the battery voltage, resulting in a reverse biased PN junction. Whenever the adjacent P-well device is connected to a voltage lower than the battery voltage and the external supply is not utilized, current can conduct through the substrate to the adjacent P-well device through this parasitic transistor. This is the result of minority carriers injected into the substrate from the forward biased PN junction of the battery protection diode and collected in the adjacent P-well. This leakage current therefore provides an unexpectedly high drain on the battery, thus reducing its lifetime and the lifetime of the battery backed-up product.

The present invention provides improved battery-backed integrated circuits, which include improved battery protection circuits for preventing battery charging. The battery power input is connected through a first junction diode, so that the battery cannot be charged when the external (system) power supply is active. The battery isolation diode is surrounded by a second junction. The second junction is preferably shorted out, by a wired connection which makes ohmic contact to the semiconductor regions on both sides of the junction. The built-in potential of this junction provides efficient collection of minority carriers, which will recombine in the neighborhood of this junction. Thus, the second junction collects the minority carriers which can be generated when the first junction is forward biased (i.e., when the integrated circuit is being powered from the battery). Otherwise, minority carriers could diffuse to other junctions, to cause leakage currents which can significantly degrade the lifetime of a low-powered device.

In the embodiments which are presently most preferred, two slightly different structures are used: one for integrated circuits which have N-type substrates (or analogous structures), and the other for integrated circuits which have P-type substrates (or analogous structures). (However, either class may also be adopted for use in a wide variety of other structures.)

In most CMOS circuits with N-type substrates, normal circuit function requires that the N-type substrate be held at the positive power supply voltage. Thus, in a battery-backed system, when the external power supply fails, the battery voltage provides power ($V_{DD}$) to the active circuits, and holds up the substrate voltage. The substrate voltage will define the voltage of the N-wells (where the PMOS devices of a CMOS integrated circuit are located). (The N-wells may be a part of the substrate, or may be separated from it by at most a high/low junction.) If the voltage of the N-wells were allowed to float, some of the PMOS devices might turn on or turn off improperly, or exhibit anomalous leakage, and thus a stored logic state could be lost.

By contrast, in most CMOS integrated circuits with P-type substrates, the P-type substrate is held at ground, and there is no need for the battery to hold up the substrate potential. However, in this case each of the various N-well regions (separated by P-type substrate) must normally be pulled up to the positive supply voltage during normal operation.

A significant device-level feature, in integrated circuits according to some embodiments of the invention, is the provision of an intermediate-depth diffusion. This intermediate-depth diffusion will have a junction depth (inside the P-well or N-well) which is significantly deeper than the source/drain junction depth, but significantly shallower than the depth of the well. This intermediate-depth diffusion is useful in the innovative diode structure described, but can also be used for other device structures. For example, this structure provides a compact bipolar transistor structure with reasonably high gain. This intermediate-depth diffusion can also be used for input protection structures (i.e. to provide device structures which will rapidly and recoverably break down, when a high-voltage pulse appears, to discharge the high-voltage pulse without damaging the primary circuitry of the chip). For another example, this intermediate-depth diffusion can also be used to form diffused capacitors with relatively large capacitance per unit area, or capacitors whose capacitance varies greatly with voltage (such capacitors are commonly referred to as varactors.)

A further advantage of this structure, and a further innovative teaching set forth herein, is that the innovative structure can be fabricated with minimal added process complexity. An intermediate-depth diffusion is added to a standard process flow; but the shallow diffusions in the battery protection structure simply make use of the source/drain implants, and the deepest diffusion simply uses the N-well (or P-well) fabrication steps.

For process, simplicity, the intermediate-depth diffusion is most preferably formed by using an implant which is identical (in dose and energy) to another implant used in the same process. The additional junction depth is achieved by exposing the earlier implant to a high-temperature step before the later implant is performed, so that the earlier implant will have a correspondingly greater diffusion length (integral $(Dt)^{0.5}$).

A variety of "substrate" structures are commonly used for integrated circuits, and far more have been proposed or have seen limited use. For example, the "substrate" which surrounds the N-wells and P-wells is often an epitaxial layer atop a much more heavily doped underlying layer. For another example, the N-wells and P-wells are commonly formed by separate implantation (and drive-in) steps, and such processes are referred to as "twin tub" processes; but alternatively one of these steps may be omitted, so that, for example, the PMOS devices might be formed directly in an N-type upper substrate portion. Other important structure types include silicon-on-insulator structures and full dielectric isolation structures, where there is no electrically continuous body linking all of the wells. It is important to note that the innovative teachings set forth herein can advantageously be adapted to a tremendous variety of substrate structures, including not only the embodiments listed or mentioned, but also many others.

It should be noted that the disclosed families of devices structures can also be used for a variety of other purposes. In particular, the disclosed structure provides a diode structure which may be adapted for use in other types of device structures, in very-low-power integrated circuit applications.

It should also be noted that some prior art CMOS structures have used guard ring structures to suppress latchup. The problem of latchup (suppressing the parasitic thyrsistor) is a guide different problem from the leakage problems discussed above, but in both cases collection of minority carriers is desirable. Guard ring structures are commonly used to surround locations (such as output drivers) where transient signals are most likely to cause injection of minority carriers. (A sufficient injection of minority carriers could fire the parasitic thyrsistor, and thus lead to latchup.)

In another class of embodiments, the innovative diffusion structure described is used in a different way. In low-power battery-backed integrated circuits, every current drain must be minimized, to conserve the charge in the battery. One drain on the battery is caused by negative excursions on an incoming data line (for example, when a negative voltage spike occurs due to an electrostatic discharge (ESD) event. In a normal battery-powered integrated circuit, the current drawn during such a negative voltage surge would be drawn both from the ground connection and also from the power supply connection. However, in stringently power-limited applications, even this amount of current, over the lifetime of the part, can use enough of the battery capacity to shorten the part's lifetime substantially.

That is, when a negative transient occurs, a large number of electrons will be injected. If these electrons are allowed to diffuse freely, many of them will diffuse toward the high-potential regions which are connected to the battery. This charge transfer reduces the total charge available during the lifetime of the battery.

Figure 8:
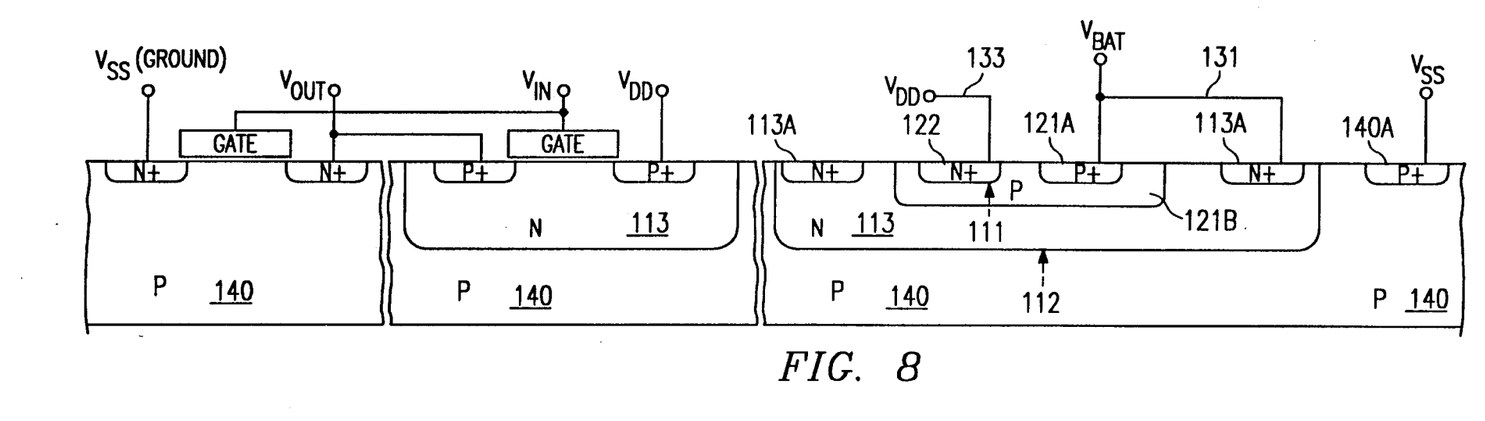
FIG. 8 shows an example of a battery protection circuit in a CMOS integrated circuit with a P-type substrate.
Figure 10:
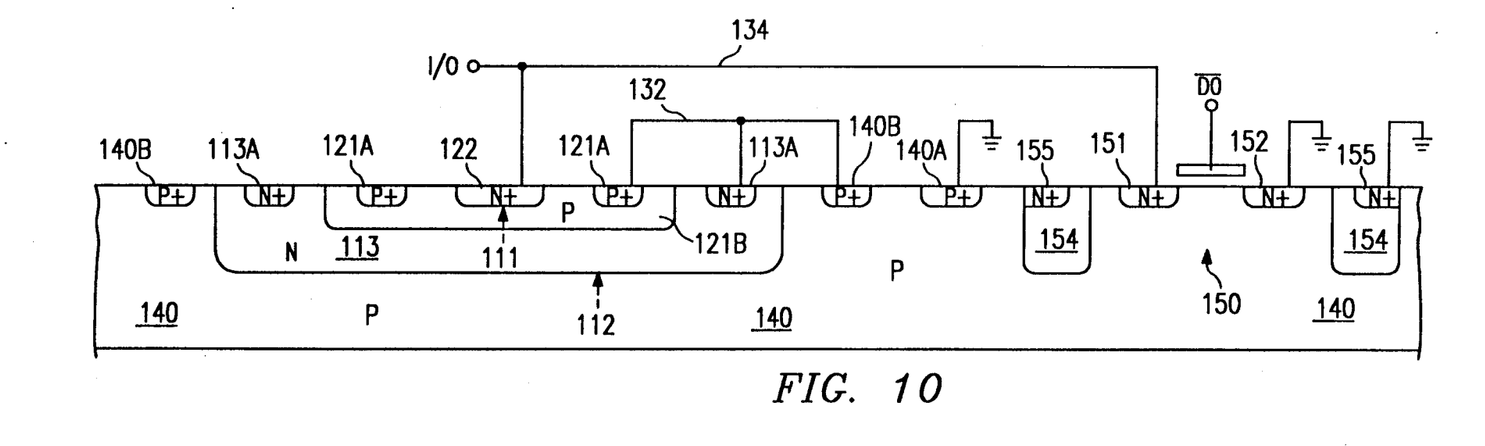
FIG. 10 shows a further alternative embodiment, wherein a diffusion structure is connected to provide ESD protection for an I/O connection of a battery-power integrated circuit.

The shielded diode structure of FIG. 8 is protected: almost all electrons injected at first junction 111 will be collected at second junction 112. By contrast, a simple FET output driver, like transistor 150 in FIG. 10, is not isolated: when the drain junction of such an NMOS FET is forward biased, electrons will be released into substrate 140, and many of these electrons can then diffuse to regions of high potential.

Therefore, a further innovative teaching is to use the innovative diffusion structure to source current to negative transients which may occur on the I/O lines of a chip. In this embodiment, an I/O line is connected so that the first junction (in a structure as described above) will be forward biased when the I/O line goes negative, and the other side of the first junction is connected to ground potential. Thus, when a negative-going transient occurs, current will be sourced, through the first junction, from ground.

When a negative-going transient occurs, some current will also be sourced, at the output transistor which drives the I/O line, and some of this current component will cause minority carrier diffusion; but the use of this innovative teaching helps to reduce the amount of current sourced which can cause minority carrier diffusion. Preferably the area of the first junction is substantially larger than that of the junction area of the source/drain diffusion, in the output transistor, which is connected to the power supply.

This innovative teaching also has two further advantages. First, the reduced risk of minority carrier injection means that the risk of stored data states being upset by transient signals is reduced. Second, the risk of latchup is reduced.

Thus, this innovative teaching advantageously provides a battery-powered integrated circuit which is protected against battery depletion by electrical noise appearing at input/output connections. This innovative teaching may be particularly advantageous in integrated circuits which are intended for use in systems where high levels of noise must be tolerated.

Among the innovations disclosed herein is an integrated circuit, comprising: an extended region of P-type monocrystalline semiconductor material; a plurality of N-well regions within the extended region, and a plurality of P-channel field-effect transistors formed in ones of the N-well regions; a plurality of N-channel field-effect transistors formed in portions of the extended region; a power terminal, for connection to a positive external power supply voltage, the power terminal being operatively connected to ones of the N-well regions; a battery terminal, for connection to a position backup power supply voltage, the battery terminal being connected to ones of the N-well regions through a structure which includes: a first region which is P-type and which is connected to the battery terminal; a second region which is N-type and which is surrounded by the first region, the first and second regions defining a first junction therebetween; and a third region which is N-type and which surrounds the first region, the first and third regions defining a second junction therebetween, the second junction surrounding the first junction; the first and third regions being ohmically connected to each other; whereby minority carriers which are injected in the vicinity of the first junction will be collected at the second junction.

Among the innovations disclosed herein is an integrated circuit, comprising: an extended region of P-type monocrystalline semiconductor material; a plurality of N-well regions within the extended region, and a plurality of P-channel field-effect transistors formed in ones of the N-well regions; a plurality of N-channel field-effect transistors formed in portions of the extended region; a power terminal, for connection to a positive external power supply voltage, the power terminal being operatively connected to ones of the N-well regions; a battery terminal, for connection to a positive backup power supply voltage, the battery terminal being connected to ones of the N-well regions through a structure which includes: a first region which is P-type and which is connected to the battery terminal; a second region which is N-type and which is surrounded by the first region, the first and second regions defining a first junction therebetween; and a third region which is N-type and which surrounds the first region, the first and third regions defining a second junction therebetween, the second junction surrounding the first junction; the first and third regions being ohmically connected to each other; whereby minority carriers which are injected in the vicinity of the first junction will be collected at the second junction; wherein the first region includes a shallow heavily doped P-type diffusion, at the surface thereof, which runs substantially parallel to the first junction for the whole length of the first junction.

Among the innovations disclosed herein is an integrated circuit, comprising: an extended region of P-type monocrystalline semiconductor material; a plurality of N-well regions within the extended region, and a plurality of P-channel field-effect transistors formed in ones of the N-wall regions; a plurality of N-channel field-effect transistors formed in portions of the extended region; a power terminal, for connection to a positive external power supply voltage, the power terminal being operatively connected to ones of the N-well regions; a battery terminal, for connection to a positive backup power supply voltage, the battery terminal being connected to ones of the N-well regions through a structure which includes: a first region which is P-type and which is connected to the battery terminal; a second region which is N-type and which is surrounded by the first region, the first and second regions defining a first junction therebetween; and a third region which is N-type and which surrounds the first region, the first and third regions defining a second junction therebetween, the second junction surrounding the first junction; the first and third regions being ohmically connected to each other; whereby minority carriers which are injected in the vicinity of the first junction will be collected at the second junction; wherein the third region includes a shallow heavily doped N-type diffusion, at the surface thereof, which runs substantially parallel to the first junction for the whole length of the first junction.

Among the innovations disclosed herein is an integrated circuit, comprising: an extended region of P-type monocrystalline semiconductor material; a plurality of N-well regions within the extended region, and a plurality of P-channel field-effect transistors formed in ones of the N-well regions; a plurality of N-channel field-effect transistors formed in portions of the extended region; a power terminal, for connection to a positive external power supply voltage, the power terminal being operatively connected to ones of the N-well regions; a battery terminal, for connection to a positive backup power supply voltage, the battery terminal being connected to ones of the N-well regions through a structure which includes: a first region which is P-type and which is connected to the battery terminal; a second region which is N-type and which is surrounded by the first region, the first and second regions defining a first junction therebetween; and a third region which is N-type and which surrounds the first region, the first and third regions defining a second junction therebetween, the second junction surrounding the first junction; the first and third regions being ohmically connected to each other; whereby minority carriers which are injected in the vicinity of the first junction will be collected at the second junction; wherein the third region includes a shallow heavily doped N-type diffusion, at the surface thereof, which runs substantially parallel to the second junction for the whole length of the second junction.

Among the innovations disclosed herein is an integrated circuit, comprising: an extended region of P-type monocrystalline semiconductor material; a plurality of N-well regions within the extended region, and a plurality of P-channel field-effect transistors formed in ones of the N-well regions; a plurality of N-channel field-effect transistors formed in portions of the extended region; a power terminal, for connection to a positive external power supply voltage, the power terminal being operatively connected to ones of the N-well regions; a battery terminal, for connection to a positive backup power supply voltage, the battery terminal being connected to ones of the N-well regions through a structure which includes: a first region which is P-type and which is connected to the battery terminal; a second region which is N-type and which is surrounded by the first region, the first and second regions defining a first junction therebetween; and a third region which is N-type and which surrounds the first region, the first and third regions defining a second junction therebetween, the second junction surrounding the first junction; the first and third regions being ohmically connected to each other; whereby minority carriers which are injected in the vicinity of the first junction will be collected at the second junction; wherein the second region is completely enclosed, except for a surface for ohmic contact, by the first region.

Among the innovations disclosed herein is an integrated circuit, comprising: an extended region of P-type monocrystalline semiconductor material; a plurality of N-well regions within the extended region, and a plurality of P-channel field-effect transistors formed in ones of the N-well regions; a plurality of N-channel field-effect transistors formed in portions of the extended region; a power terminal, for connection to a positive external power supply voltage, the power terminal being operatively connected to ones of the N-well regions; a battery terminal, for connection to a positive backup power supply voltage, the battery terminal being connected to ones of the N-well regions through a structure which includes: a first region which is P-type and which is connected to the battery terminal; a second region which is N-type and which is surrounded by the first region, the first and second regions defining a first junction therebetween; and a third region which is N-type and which surrounds the first region, the first and third regions defining a second junction therebetween, the second junction surrounding the first junction; the first and third regions being ohmically connected to each other; whereby minority carriers which are injected in the vicinity of the first junction will be collected at the second junction; wherein the integrated circuit is formed in an epitaxial semiconductor layer on a monocrystalline semiconductor body.

Among the innovations disclosed herein is an integrated circuit, comprising: an extended region of P-type monocrystalline semiconductor material; a plurality of N-well regions within the extended region, and a plurality of P-channel field-effect transistors formed in ones of the N-well regions; a plurality of N-channel field-effect transistors formed in portions of the extended region; a power terminal, for connection to a positive external power supply voltage, the power terminal being operatively connected to ones of the N-well regions; a battery terminal, for connection to a positive backup power supply voltage, the battery terminal being connected to ones of the N-well regions through a structure which includes: a first region which is P-type and which is connected to the battery terminal; a second region which is N-type and which is surrounded by the first region, the first and second regions defining a first junction therebetween; and a third region which is N-type and which surrounds the first region, the first and third regions defining a second junction therebetween, the second junction surrounding the first junction; the first and third regions being ohmically connected to each other; whereby minority carriers which are injected in the vicinity of the first junction will be collected at the second junction; wherein the N-channel transistors are formed within P-well regions which are more heavily doped than the extended region.

Among the innovations disclosed herein is an integrated circuit, comprising: an extended region of P-type monocrystalline semiconductor material; a plurality of N-well regions within the extended region, and a plurality of P-channel field-effect transistors formed in ones of the N-well regions; a plurality of N-channel field-effect transistors formed in portions of the extended region; a power terminal, for connection to a positive external power supply voltage, the power terminal being operatively connected to ones of the N-well regions; a battery terminal, for connection to a positive backup power supply voltage, the battery terminal being connected to ones of the N-well regions through a structure which includes: a first region which is P-type and which is connected to the battery terminal; a second region which is N-type and which is surrounded by the first region, the first and second regions defining a first junction therebetween; and a third region which is N-type and which surrounds the first region, the first and third regions defined a second junction therebetween, the second junction surrounding the first junction; the first and third regions being ohmically connected to each other; whereby minority carriers which are injected in the vicinity of the first junction will be collected at the second junction; wherein the N-channel transistors are formed within the extended region.

Among the innovations disclosed herein is an integrated circuit, comprising: an extended region of P-type monocrystalline semiconductor material; a plurality of N-well regions within the extended region, and a plurality of P-channel field-effect transistors formed in ones of the N-well regions; a plurality of N-channel field-effect transistors formed in portions of the extended region; a power terminal, for connection to a positive external power supply voltage, the power terminal being operatively connected to ones of the N-well regions; a battery terminal, for connection to a positive backup power supply voltage, the battery terminal being connected to ones of the N-well regions through a structure which includes: a first region which is P-type and which is connected to the battery terminal; a second region which is N-type and which is surrounded by the first region, the first and second regions defining a first junction therebetween; and a third region which is N-type and which surrounds the first region, the first and third regions defined a second junction therebetween, the second junction surrounding the first junction; the first and third regions being ohmically connected to each other; thereby minority carriers which are injected in the vicinity of the first junction will be collected at the second junction; wherein the first region is more heavily doped than the third region.

BRIEF DESCRIPTION OF THE DRAWINGS

The present invention will be described with reference to the accompanying drawings, which show important sample embodiments of the invention and which are incorporated in the specification hereof by reference, wherein:

FIG. 1a illustrates a cross-sectional diagram of a prior art battery protection circuit, and FIG. 1b illustrates a schematic diagram of the parasitic PNP transistor in the prior art structure of FIG. 1a.

FIG. 2 illustrates a cross-sectional diagram of a first sample embodiment of the battery protection circuit of the present invention;

FIG. 3 illustrates an electrical schematic of the parasitic PNP transistors of the battery protection circuit of FIG. 2;

FIG. 4a illustrates a cross-section of a portion of the structure shown in FIG. 2.

It should be appreciated that these drawings are not drawn to scale, and, in particular, that the vertical dimensions may have been exaggerated for clarity.

DESCRIPTION OF THE PREFERRED EMBODIMENTS

The numerous innovative teachings of the present application will be described with particular reference to the presently preferred embodiment, wherein these innovative teachings are advantageously applied to the particular problems of a low-power CMOS integrated circuit fabricated in twin-tub CMOS technology. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figures 1A, 1B, 2, 3, 4A:
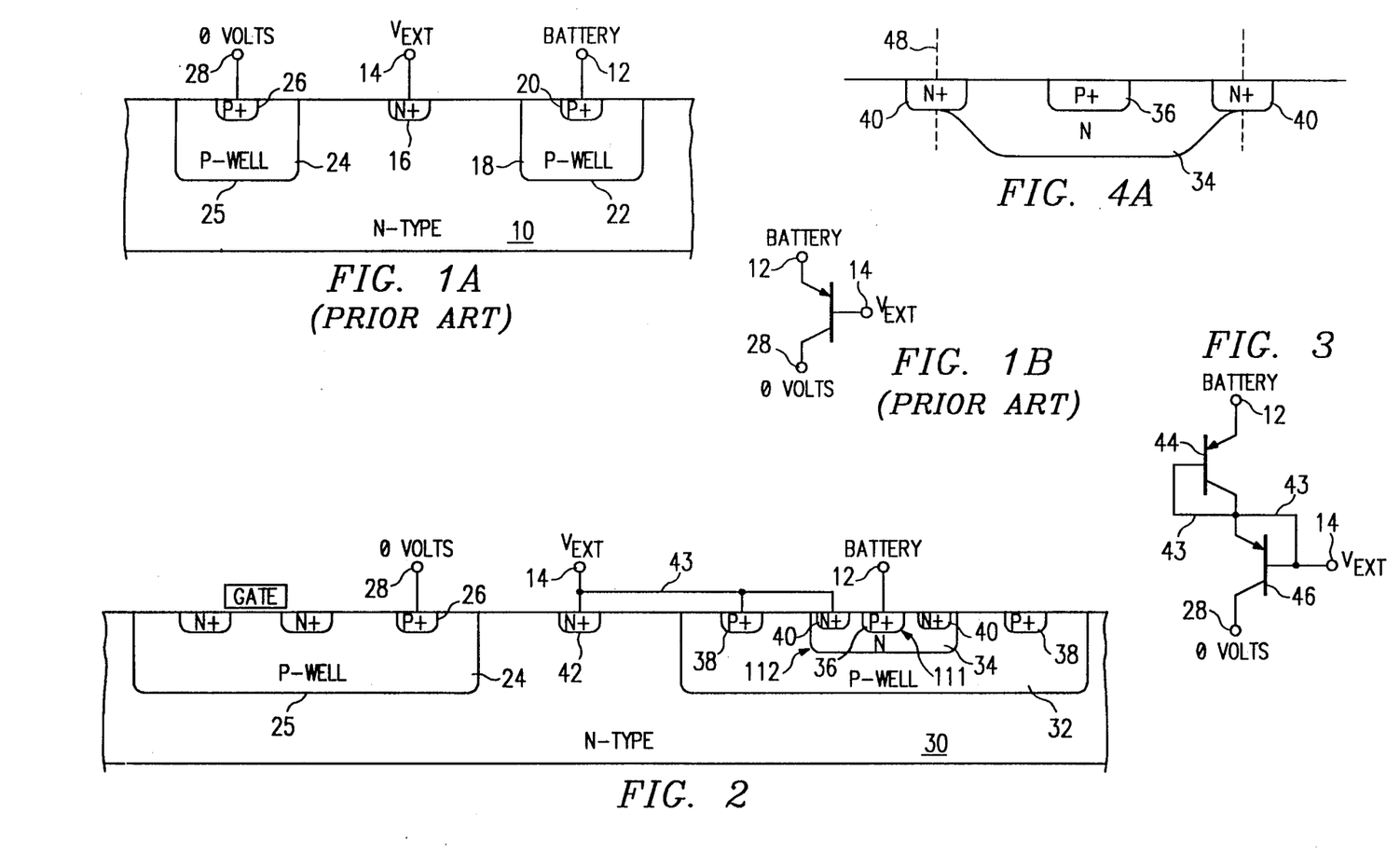

Referring now to FIG. 1a, there is illustrated a cross-sectional diagram of a semiconductor substrate 10 utilizing a prior art battery protection device. In this type of device, a battery terminal 12 is provided for being connected to a battery (not shown) and an external voltage terminal 14 is provided for being connected to an external (system) supply voltage $V_{EXT}$. The battery terminal 12 is typically at a lower voltage than the external supply voltage $V_{EXT}$. For example, the battery voltage for most battery-backed systems is typically around three volts, whereas the external $V_{EXT}$ is typically around five volts.

The external supply terminal 14 is connected to the substrate 10, which is an N-type semiconductor substrate in this example, through an n+contact region 16. The battery terminal 12 is connected to a P-well 18 through a p+contact region 20. The boundary of the P-well 18 forms a PN junction 22. Therefore, when the N-type substrate 10 is at a lower potential than the battery terminal 12, current will flow through the forward biased PN junction 22 from the battery terminal 12. However, when the external supply terminal 14 is a higher voltage than the battery terminal 12, the PN junction 22 is reverse biased and blocks current. This essentially prevents current flowing from the external terminal 14 to the battery terminal 12 and thus charging the battery.

In a typical CMOS semiconductor device utilizing P-wells and N-wells in a twin-tub process, there will be additional P-wells that are separated from the P-well 18. One of these is represented by a P-well 24, which is disposed in the N-type substrate 10 and separated from the P-well 18 by a predetermined minimum spacing in the N-type substrate 10. A PN junction 25 is formed between the N-type substrate 10 and the P-well 24. The P-well 24 can be utilized to configure any type of device. In order to contact the P-well 24, a p+contact 26 is provided which is connected to an external circuit terminal 28. It should be understood that the illustrated structure merely represents a partial example of such a P-well structure. (For example, such a P-well would usually include at least two shallow N+diffusions, to provide the source/drain regions of an MOS transistor. Such a P-well may contain three or more such N+diffusions, to provide more than one transistor, and may also be configured to provide other elements as well, e.g., diodes or capacitors.)

A problem arises with the prior art device whenever the external voltage falls (e.g. when the terminal 14 is disconnected from $V_{EXT}$, or the system power supply fails), so that the external circuit terminal 28 is connected to a voltage lower than the battery terminal. In the structure shown in FIG. 1, this will reverse bias the PN junction 25. In this mode, minority carriers (holes, in this example) which are injected into the substrate 10 at the forward biased PN junction 22 can be collected at the PN junction 25. This results in the formation of a leaky parasitic PNP transistor. This parasitic PNP transistor is illustrated in FIG. 1b. This transport of holes creates a net current, from the battery terminal 12 to the ground terminal 28, which dissipates power.

The parasitic transistor of FIG. 1b has the emitter junction formed between the P-well 18 and the N-type substrate 10 with the battery terminal 12 providing the emitter terminal. The base is formed by the N-type substrate 10 with the base terminal comprising the external voltage terminal 14. The collector junction is formed between the P-well 24 and the N-type substrate 10 with the external circuit terminal 28 representing the collector terminal. It can be seen that whenever the external voltage terminal 14 is disconnected, the parasitic transistor illustrated in FIG. 1b passes leakage current. This results in leakage current, which, in a relatively low power device, can comprise a significant portion of the supply current, since there are usually a number of adjacent P-wells on the substrate with a parasitic transistor connected to each of the adjacent P-wells. Since the bases of all of these transistors will be common, this effectively forms a multi-collector parasitic transistor.

FIGS. 2 and 8 show two important embodiments of the disclosed innovative diode structure. In each, the battery power input is connected through a first junction 111, so that the battery cannot be charged when the external (system) power supply is active. The battery isolation diode junction 111 is surrounded by a second junction 112. In the embodiment of FIG. 2, the first junction 111 is the boundary of P+first region 36 and N-type second region 34, and the second junction 112 is the boundary of N-type second region 34 with P-type third region (P-well) 32. In the embodiment of FIG. 8, the first junction 111 is the boundary of P-type first region 121 (including 121A and 121B) and N-type second region 122, and the second junction 112 is the boundary of P-type first region portion 121B with P-type third region 113. Note that, in FIG. 2, the second region 34 encloses the first region 36, whereas, in the embodiment of FIG. 8, the first region 121 encloses the second region 122.

The second junction 112 is preferably shorted out, by a wired connection which makes ohmic contact to the semiconductor regions on both sides of the junction. In the embodiment of FIG. 2, the wiring 48 which shorts out the second junction makes ohmic contact to the second region 34 at N+diffusion 40, and makes ohmic contact to the third region 32 at P+diffusion 38, and is also ohmically connected to N-type extended region (substrate) 30 at N+diffusion 42, and is also tied to external supply voltage $V_{EXT}$. In the embodiment of FIG. 8, the wiring 131 which shorts out the second junction makes ohmic contact to the first region 121 at P+diffusion 121A, and makes ohmic contact to the third region 113 at N+diffusion 113A, and is also ohmically connected to the battery terminal $V_{BAT}$.

The built-in potential of second junction 112 provides efficient collection of minority carriers, which will recombine in the neighborhood of this junction. Thus, the second junction collects the minority carriers which can be generated when the first junction 111 is forward biased (i.e. when the integrated circuit is being powered from the battery). Otherwise, minority carriers could diffuse to other junctions, to cause leakage currents which can significantly degrade the lifetime of a low-powered device.

Note also that the structures of FIG. 2 and FIG. 8 both include an intermediate-depth diffusion, with a junction depth which is significantly deeper than the source/drain junction depth, but significantly shallower than the depth of the well. In the embodiment of FIG. 2, this intermediate-depth diffusion is provided by the N-type second region 34. In the embodiment of FIG. 8, this intermediate-depth diffusion is provided by the P-type first region portion 121A.

Referring now to FIG. 2, there is illustrated a cross-sectional diagram of a preferred embodiment of the battery protection devices of the present invention formed in an N-type substrate 30. A P-well 32 is formed in the N-type substrate 30, having a depth of approximately four microns. An N-type region 34 is formed in the P-well 32 to a depth of approximately 0.8 microns. A p+region 36 is formed within the N-type region 34. In this sample embodiment, the p+region 36 has a thickness of approximately 0.40 microns. A p+contact 38 is provided that surrounds or forms a ring around the N-type region 34 to provide a contact to the P-well 32. In a similar manner, an n+contact 40 is provided that surrounds the p+region 36 to provide contact from the surface to the N-type region 34. An n+contact 42 is provided in the N-type substrate 30 outside the boundaries of the P-well 32. The external voltage terminal 14, having the voltage $V_{EXT}$ connected thereto, is interfaced with the n+region 42. In a similar manner, the battery terminal 12 is interfaced with the p+region 36. In addition, the external voltage terminal 14 is connected to the p+region 38 and to the n+region 40 through an interconnect line 43.

The P-well 24 and associated p+region 26 and external circuit terminal 28 are also provided in the substrate 30 to illustrate the formation of the reverse biased PN junction 25. As will be described hereinbelow, the present invention prevents conduction from the battery terminal 12 to the PN junction 25 when the PN junction 25 is reverse biased. For illustrative purposes, the external circuit terminal 28 is connected to a voltage lower than the battery terminal, for example, zero volts.

The parasitic transistors formed in the structure of FIG. 2 is illustrated in FIG. 3. A first PNP transistor 44 is formed having the emitter thereof connected to the battery terminal 12, the base thereof connected to the collector thereof and the collector thereof connected to the emitter of a second PNP transistor 46. The second PNP transistor 46 has the base thereof connected to the external supply terminal 14 and also connected to the emitter thereof. The collector of the second PNP transistor 46 is connected to the external circuit terminal 28. The transistor 44 has the emitter thereof formed by the junction between the p+region 36 and the N-type region 34, the base thereof formed by the N-type region 34 and the collector thereof formed by the junction between the N-type region 34 and the P-well 32. The transistor 46 has the emitter thereof formed by the junction between the P-well 32 and the N-type region 30, the base thereof formed by the N-type region 30 and the collector thereof formed by the junction between the N-type region 30 and the P-well 24.

In operation, the P-type transistor 44 has the base thereof connected to the collector, and thus, it is configured as a diode. This allows current to flow through the collector of transistor 44 when the battery terminal 12 is at a higher voltage than the N-type substrate 30. However, the emitter-to-base junction of transistor 46 is shorted, thereby inhibiting operation of the transistor 46. Therefore, when the external voltage terminal 14 is at a lower voltage than the battery terminal 12, there is no parasitic transistor operation that results in leakage from the battery terminal 12 to the P-well 24.

Referring further to FIGS. 2 and 3, conduction in the parasitic transistor of the prior art normally occurs as a result of minority carriers being injected into the N-type substrate 30 and being collected in the P-well 24. This collection is a result of reverse biased PN junction 25. In order to prevent conduction in the parasitic transistor, it is necessary to prevent either injection of the minority carriers into the N-type substrate 30, or prevent subsequent collection thereof by the P-well 24. This, in effect, kills the gain of the parasitic transistor.

In the present invention, the minority carriers exist in the N-type region 34 as holes. The P-well 32 is biased at the same potential as the N-region 34 and therefore acts as a collector for the minority carriers or holes. However, it should be understood that any barrier which prevents migration of minority carriers over to the PN junction 25 to allow collection thereby the P-well 32 will produce the same result. For example, an insulating layer could be utilized that total encloses the N-type region 34, which insulator would adequately prevent minority carrier injection. Further, the holes, which are collected in the P-well 32, could be recombined in a very heavily doped N-type region that was disposed around the N-region 34 in place of the P-well 32. This would effectively perform a recombination of the holes therein to prevent the holes from migrating into the N-type substrate 30. This heavily doped N-type region could also be disposed around the P-well 24.

With further reference to FIG. 2, the P-well 32 is provided as a collector of minority carriers. The purpose of the electrical connection 43 is to provide a path for free electrons or majority carriers. The holes generated in the N-type region 34 as a result of the forward biased PN junction between p+region 36 and N-type region 34 are recombined at the junction between the electrical connection 43 and the n+region 40, thus preventing the minority carriers from flowing through electrical connection 43 to the N-type substrate 30. It is possible that this electrical connection 43 could be replaced by a conductive n++plug that is disposed through the P-well 32 to the N-type substrate 30 to connect the N-region 34 and the N-type substrate 30. However, an electrical connection would still be required between the P-well 32 and the N-type region 34 to provide the correct bias therefore.

Although the present invention was described with respect to an N-type substrate and parasitic PNP transistors, it should be understood that the dual of this structure could provide the same result wherein the battery-voltage were a negative voltage and the overall system operated on a negative voltage. For example, the battery diode protection circuit would now have an n+region connected to the battery and a P-type region providing the other side of the diode. An N-well would be disposed therearound isolating the diode from a P-type substrate. The N-well would provide the minority carrier isolation and act as a collector therefore, the minority carriers being electrons in this case. This would prevent minority carriers from being collected in an adjacent N-well to form a leaky NPN transistor.

Figure 4:
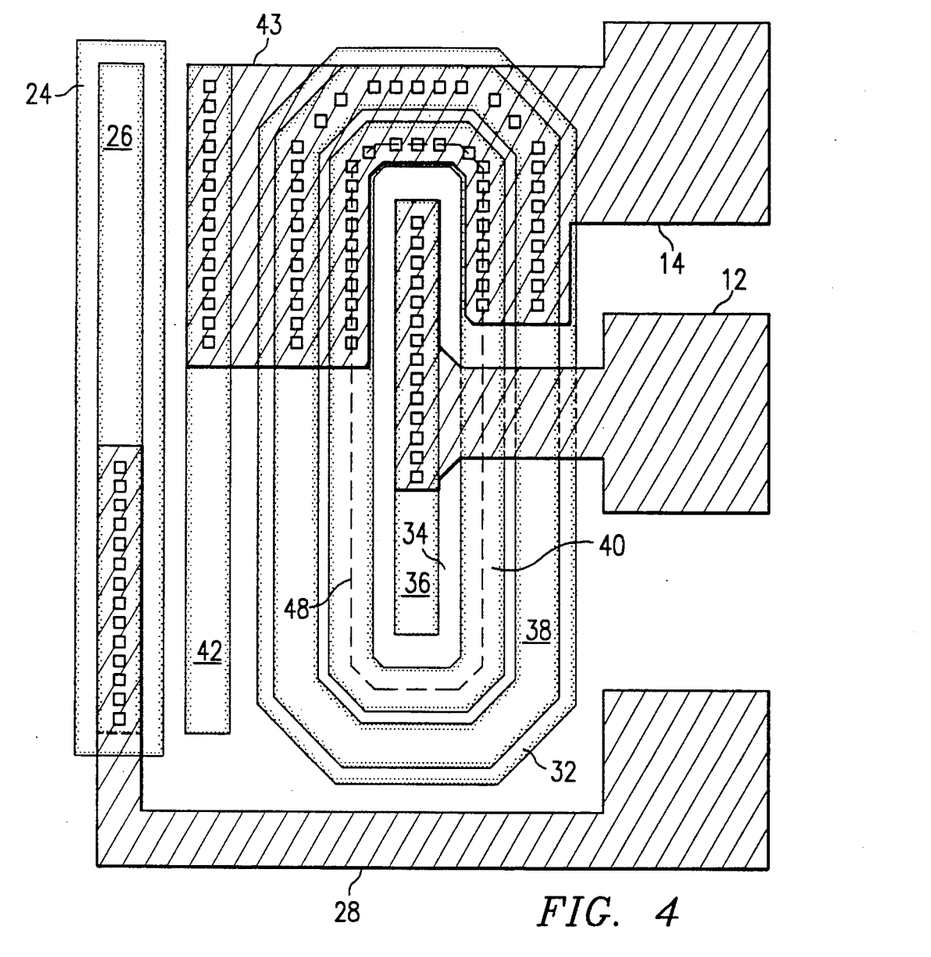
FIG. 4 illustrates a top view of the battery protection circuit of FIG. 2.

Referring now to FIG. 4, there is illustrated a top-level diagram of the structure of FIG. 2. The p+region 36 is formed as an elongated implant that is surrounded by the n+region 40. The n+region 40 is in turn surrounded by the p+region 38. The N-type region 34 to which the n+region 40 is connected, does not extend entirely under the n+region 40 to the exterior boundary thereof. Rather, the external boundary of the N-type region 34 is defined by a border 48. A detail of the N-type region 34 is illustrated in FIG. 4a. The P-well 32 is illustrated as surrounding the p+region 38. The n+region 42 is formed from an elongated implanted region that is disposed adjacent to the P-well 32. In a similar manner, the P-well 24 is also elongated and disposed adjacent the n+region 42 with the p+region 26 disposed within the P-well 24 and also having an elongated configuration.

The protection circuit of the present invention is interleaved with a standard twin tub CMOS process flow. In the standard process, N- and P-channel device regions are defined and then a P-well formed by implanting boron into the N-channel device region and an N-well formed by implanting phosphorus into the P-channel device region. These implants are then driven down into the substrate and then active regions defined therein and separated by a layer of field oxide. Typically, a layer of nitride is disposed over a thin oxide layer to define the active regions and then a field oxide grown on the portions of the substrate not having nitride formed thereover.

After formation of the field oxide isolation regions, the residual nitride layers are removed. There is still a layer of gate oxide over the active region remaining on the surface thereof. The surface is then masked for the implanting of the N-type region 34. This implant is achieved with phosphorous at an energy level of 180 KeV at a dosage of $5 \times 10^{13} cm^{-2}$. After implanting of the N-type region 34, the residual oxide on the surface of the active region is removed and then a strip gate oxide is formed over the substrate. The active regions are then implanted to adjust the transistor threshold voltages.

After threshold voltages are adjusted, the strip gate oxide is removed and the final gate oxidation is performed, followed by polysilicon deposition and subsequent doping thereof. The poly is then patterned and etched to define the various gates and interconnects at a first level of poly. The N-channel source and drain areas are then defined to form the source/drain implants. This is an n+implant utilizing arsenic, which implant is also utilized to form the n+regions 40 and 42. The substrate is then masked to form the p+source/drain implants, at which time the p+regions 36, 38 and 26 are formed. Thereafter, the interlevel oxide is formed by depositing oxide thereover and this oxide is subjected to a thermal cycle to reflow the oxide and to provide the source/drain activation and drive steps. The subsequent contacts are then defined and etched and then a layer of metal deposited thereover. The metal layer is then patterned and etched to define the various metal interconnects.

Figure 5:
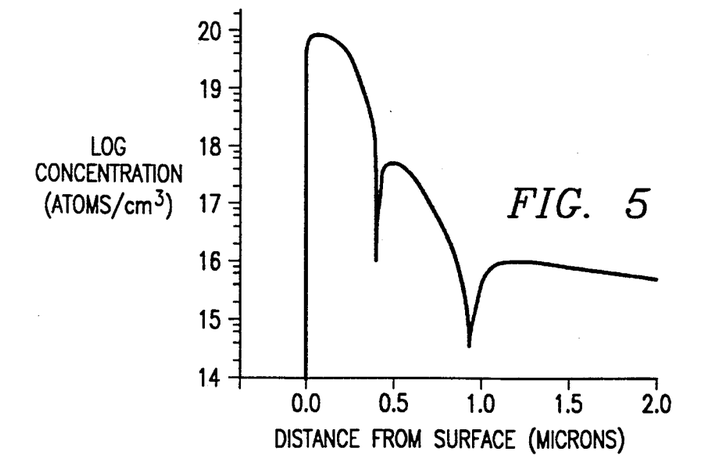
FIG. 5 illustrates a dopant profile a sample embodiment of the battery protection circuit of FIG. 2.

Referring now to FIG. 5, there is illustrated a vertical dopant profile through regions 36, 34, and 32 of FIG. 2. The dopant profile illustrates that the p+region 36 has a surface concentration of approximately $1 \times 10^{20} cm^{-3}$ and a thickness of approximately 03.5 microns. The N-type region 34 has a thickness of approximately 0.4 microns with a peak concentration of approximately $4 \times 10^{17} cm^{-3}$. The concentration level of the P-well 32 is approximately $1 \times 10^{16} cm^{-3}$. Therefore, the PNP transistor 44 formed by the p+region 36, the N-type region 34 and the P-well region 32 has a base width of approximately 0.4 microns.

Figure 6:
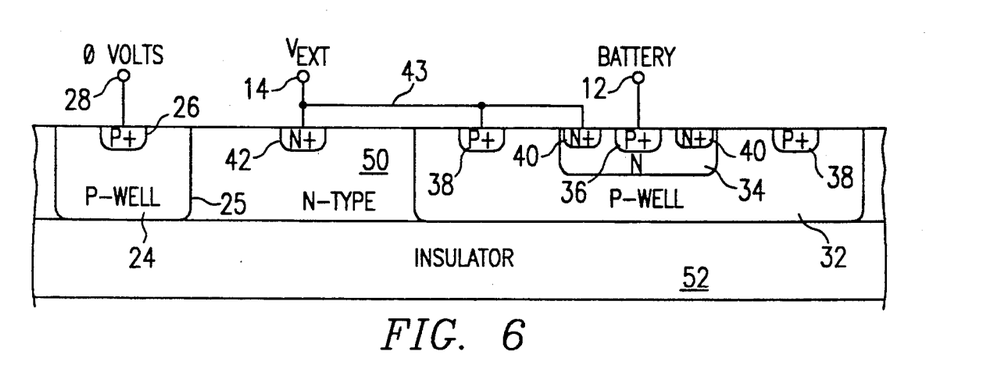
FIG. 6 illustrates a cross-sectional view of an alternate embodiment of the present invention utilizing a Silicon-On-Insulator construction.

Referring now to FIG. 6, there is illustrated an alternate embodiment of the present invention. In the alternate embodiment, the diode structure of the present invention is formed in an N-type substrate 50, which N-type substrate 50 is disposed over a layer of insulating material 52. This is normally referred to as Silicon-On-Insulator (SOI) technology. In this type of technology, an N-type substrate is first formed and then a layer of insulating material formed on the lower surface thereof. The N-type substrate 50 is typically dimensioned to equal the thickness of the P-well 32 and the P-well 24 such that no N-type material is disposed therebelow. In this manner, isolation between internally disposed devices is increased.

There are numerous techniques for fabricating integrated circuits utilizing SOI technology. Some of these techniques require formation of the active device on the surface of an N-type substrate followed by deposition of a thick layer of oxide and polysilicon thereover. The substrate is then held from the upper side and the lower surface thereof etched down a predetermined distance. Typically, some type of heavily doped buried layer is implanted into the substrate to form an etch stop layer. The insulator is then formed on the remaining surface of the substrate under the active devices, the thick layer of polysilicon and oxide removed and the final patterning performed on the upper surface of the substrate. However, this is only one technique and numerous other techniques are available for realizing SOI technology.

Figure 7:
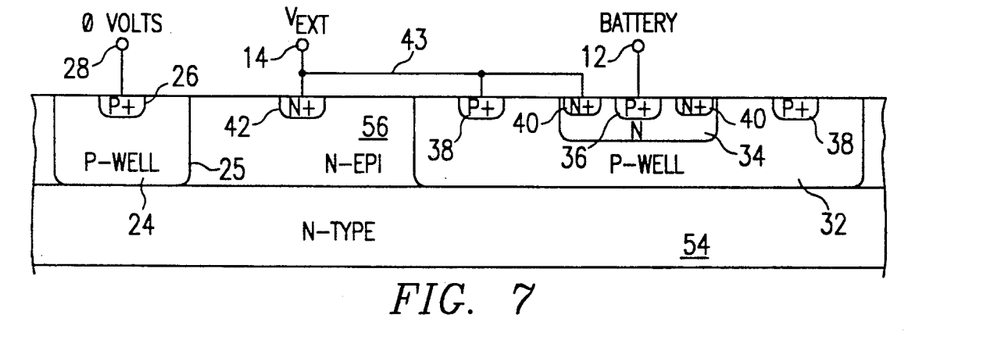
FIG. 7 illustrates a cross-sectional diagram of yet another embodiment of the present invention, wherein the structure is fabricated in an epitaxial layer disposed on top of semiconductor material.

Referring now to FIG. 7 there is illustrated yet another embodiment of the present invention. An N-type substrate 54 is provided upon which a layer of epitaxially grown N-type semiconductor material 56 is grown. The P-well 24 and the P-well 32 are then formed therein with the N-type epitaxial layer 56 having a thickness approximately equal to that of the P-wells 24 and 32. The N-type substrate 54 has a higher doping level than the epitaxial layer 56, resulting in the parasitic transistors being confined primarily to the epitaxial layer 56. The epitaxial layer 56 is formed utilizing conventional processes well-known in the art.

In summary, there has been provided a battery protection device that reduces leakage due to the existence of a parasitic PNP transistor between the battery terminal and an adjacent P-well. The battery protection device includes a diode that is enclosed by a layer of P-type material. The layer of P-type material is operable to collect minority carriers to prevent collection thereof by an adjacent P-well with a reverse biased PN junction.

FIG. 8 shows another embodiment of the invention, which has been found to be advantageous for use with P-type substrates. Specifics for this embodiment will be described in the context of a 1.2 micron CMOS process, but of course the process can readily be scaled or modified, as will be apparent to skilled CMOS designers and process engineers.

The substrate 140, in this embodiment, is P-type silicon, doped to a bulk resistivity in the neighborhood of 30–40 ohm-cm. The substrate is shown ohmically connected to ground through a shallow P+diffusion 140A, but in addition to (or instead of) this contact, backside contact may also be used for connection to ground.

An N-well 113 has essentially the same doping profile as the N-wells which are used to build PMOS active devices, and is formed in the same series of implantation and drive steps. In this sample embodiment, the N-well is about 4 microns deep, and has a vertically graded dopant concentration in the neighborhood of $2-3\times10^{16}$ cm$^{-3}$. A shallow N+diffusion 113A is formed inside this region, by using the same implant as is used to form the N+source/drain regions in the active device regions. This shallow N+diffusion will normally be quite heavily doped, but the depth and concentration of this region are not particularly critical for purposes of the structure of FIG. 8. Typically the concentration might be in the range of $1\times10^{19}$ cm$^{-3}$ to $3E^{20}$ cm$^{-3}$, with an effective depth in the neighborhood of 0.3 microns. The shallow N+diffusion 113A provides ohmic contact to wiring 131, which is electrically connected to the battery voltage $V_{BAT}$.

An intermediate-depth P-type region 121 is formed inside the N-well 113. In the presently preferred embodiment, this is formed by implanting boron at an areal dose in the approximate range of $6\times10^{13}$ cm$^{-2}$ to $1\times10^{14}$ cm$^{-2}$ at an energy of about 30 keV, but of course other doses or energies can be substituted.

A shallow N+diffusion 122 is formed inside the region 121, by using the same implant as is used to form the N+source/drain regions in the active device regions. This shallow N+diffusion will normally be quite heavily doped, but the depth and concentration of this region are not particularly critical for purposes of the structure of FIG. 8. Typically the concentration might be in the range of $1\times10^{19}$ cm$^{-3}$ to $3\times10^{20}$ cm$^{-3}$, with an effective depth in the neighborhood of 0.3 microns. The N+diffusion 122 makes ohmic contact to wiring 133, which is routed to provide the $V_{DD}$ on-chip supply voltage for the active circuits on the chip.

A shallow P+diffusion 121A is also formed inside the region 121B, by using the same implant as is used to form the P+source/drain regions in the active device regions. This shallow P+diffusion will normally be quite heavily doped, but the depth and concentration of this region are not particularly critical for purposes of the structure of FIG. 8. Typically the concentration might be in the range of $1\times10^{19}$ cm$^{-3}$ to $3\times10^{20}$ cm$^{-3}$, with an effective depth in the neighborhood of 0.3 microns. The shallow P+diffusion 121A provides ohmic contact to wiring 131, which is electrically connected to the battery voltage $V_{BAT}$.

Figure 9A:
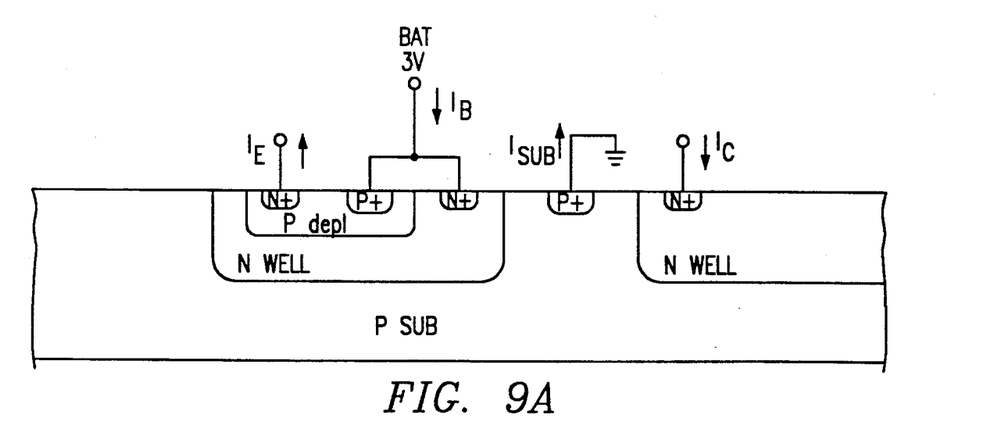
FIG. 9A shows a test structure which is similar to the device structure of FIG. 8.
Figure 9B:
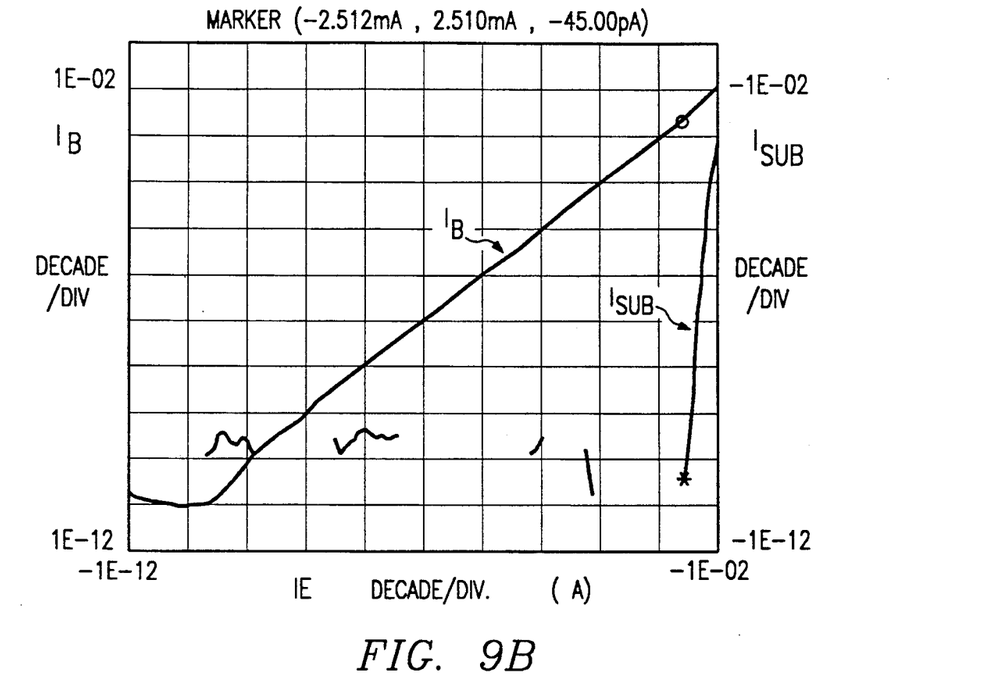
FIG. 9B shows test data for this structure.

FIG. 9A shows a test structure which is similar to the device structure of FIG. 8, and FIG. 9B shows test data for this structure. In recording this data, collector terminal (marked $I_C$ in FIG. 9A) was connected to the emitter terminal (marked $I_E$). The battery was held at a constant voltage $V_{BAT}=3$ V. The battery current $I_B$ and substrate current $I_{SUB}$ were measured as a function of the emitter current $I_E$ drawn from the second region 122. Thus, two curves are shown in this log-log plot. Note that the substrate current $I_{SUB}$ remains down in the noise level until the emitter current $I_E$ becomes quite large. (This low value of the substrate current is highly advantageous.) At the point circled on the $I_B$ curve, $I_E=-2.512$ mA, and $I_B=2.510$ mA. At the point marked with an asterisk on the $I_{SUB}$ curve, $I_E=-2.512$ mA, and $I_{SUB}=-45$ pA.

FIG. 10 shows a further alternative embodiment, wherein a diffusion structure is connected to provide ESD protection for an I/O connection of a battery-powered integrated circuit. Note that the region 122 is not connected to provide a $V_{DD}$ output, but instead is connected to an input/output line 134. (The I/O terminal can also optionally be connected to a transistor gate, for amplification of incoming data signals, but this is not necessary.) The I/O line 134 is also connected to be driven by an NMOS output driver 150. This transistor, as shown, includes a first source/drain diffusion 151, which is ohmically connected to the I/O line 134, a second source/drain diffusion 152, which is ohmically connected to ground, and a gate 158 which can be driven by a data-output signal DO-bar. (Of course, other device structures, such as additional ESD protection structures, can optionally be combined with the structure shown.)

The structures of FIG. 10, in the preferred embodiment, uses several enclosure relationships in its geometry. The central diffusion 122 is shown small, for clarity, but may itself be large. The P+diffusion 121A preferably runs all around the P-type intermediate diffusion 121. As presently contemplated, lateral dimensions for the example are as follows. (However, it must be understood that these dimensions are intended to be purely illustrative, and should not be strictly relied on. These dimensions are included merely to help show the inventors' present views as to the best mode of practicing this embodiment of the invention.) The N+ diffusion 122 is preferably separated from P+diffusion 121A by a minimum spacing of at least 3 microns (in a 1.2 micron layout), and the ring diffusion 121A is preferably at least 5 microns wide. The N+diffusion 113A preferably runs in a ring all around the edge of the well 113. The N+diffusion 122 is preferably at least 5 microns wide, and is separated from the P+diffusion 121A by at least 3 microns. The P+diffusion 140B, in the substrate 140, preferably runs all the way around the outside of the N-well 118. The minimum spacing between P+diffusion 140B and N+diffusion 113A is preferably at least 3 microns, and P+diffusion 140B is preferably at least 5 microns wide.

The output transistor 150 is preferably surrounded by a ring 154 of N-well, and this ring is tied to ground through a shallow N+diffusion 155 at its surface.

The structure of FIG. 10 has the advantage that, when a negative transient appears on the I/O line 134 for any reason (such as electrical noise on a line, or electrostatic discharge), most of the current sourced to this negative transient will be taken from the junction 111, rather than from the output transistor. Thus, minority carrier diffusion to discharge the battery is minimized, and battery lifetime is not decreased by such transient events. This advantageously provides a system which is longer-lived and more reliable. However, when the I/O lines 134 is in its normal range of positive voltages (e.g., during normal operation at TTL levels), the first junction in the diode structure will be reverse biased, and will not load the line 134.

Figure 11:
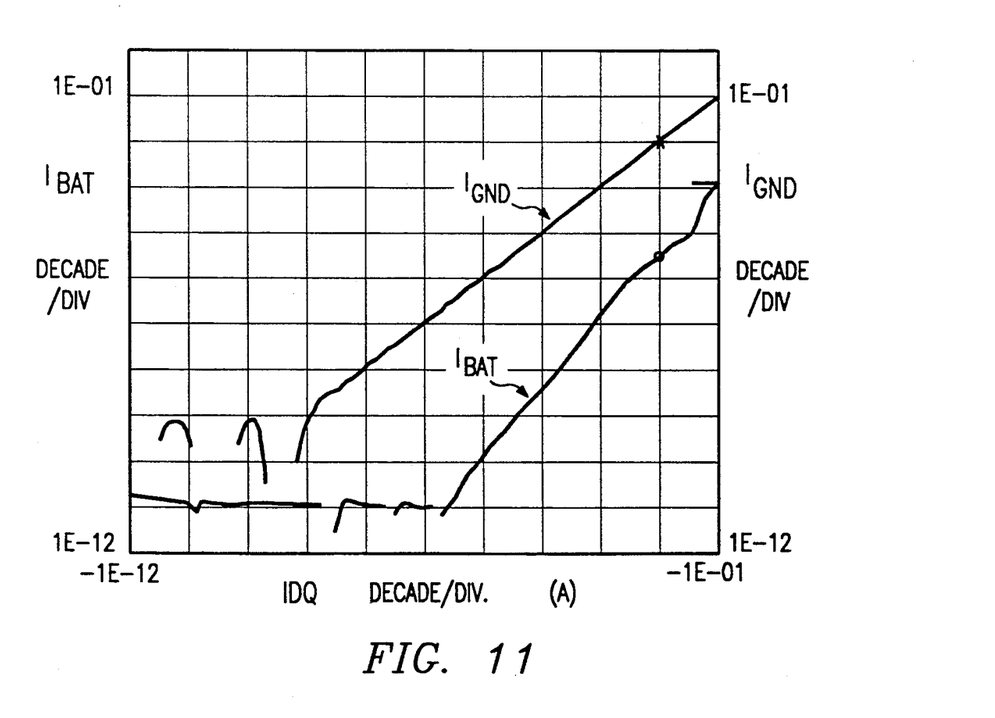
FIG. 11 shows test data for the device structure of FIG. 10.

FIG. 11 is a log-log plot of data for the device structure of FIG. 10. A controlled current sink $I_{DQ}$ is applied to the I/O connection 134, and two current components are measured as a function of $I_{DQ}$, the current $I_{BAT}$ drawn from the supply voltage $V_{BAT}$, and the current component $I_{GND}$ drawn from the ground connection. At the point circled on the $I_{BAT}$ curve, $I_{DQ}=-10.00$ mA, and $I_{BAT}=18.15$ microA. As the point marked with an asterisk on the $I_{GND}$ curve, $I_{DQ}=-10.00$ mA, and $I_{GND}=9.982$ mA.

In the structure measured in FIG. 11, the effective area of the first junction 111 (which is protected by the second junction 112) is approximately ten times that of the junction area in the output transistor 150 (which also can source current from ground). Thus, a current differential of about 10:1 might be expected, purely due to the geometrical ratios. However, higher ratios (almost 100:1) are actually achieved. Thus, FIG. 11 shows that the ratio of ground-sourced current to battery-sourced current is greater than 500:1 is achieved for a 10 mA load, and even higher ratios can be achieved at lower load currents.

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested herein are merely illustrative. These examples may help to show some of the scope of the inventive concepts, but these examples do not nearly exhaust the full scope of variations in the disclosed novel concepts.

For example, in addition to the modifications described above, the disclosed innovative structures can readily be adapted to opposite power supply polarity (i.e. to positive-ground systems), simply by reversing all conductivity types and voltage polarities in the principal embodiments. For another example, the innovative concepts can be used with a wide variety of power supply voltage standards, including lower or higher supply voltages (e.g. to 3.3 V systems, 12 V systems, or many others).

For another example, many of the disclosed innovations can readily be adapted for use in systems which are primarily battery-powered, as well as those which are battery-backed (i.e. which operate off battery power only when the system power fails), or to other types of battery-backed systems.

In addition, the disclosed innovations can also be applied to different device technologies, and particularly to other low-power technologies, and/or to modifications of CMOS technology. For example, the disclosed innovations could be adapted to use with hybrid technologies such as biCMOS (although biCMOS chips are not, at present, normally designed for low power applications where the present innovations are particularly advantageous).

As will be recognized by those skilled in the art, the innovative concepts described in the present application can be modified and varied over a tremendous range of applications, and accordingly their scope is not limited except by the allowed claims.

What is claimed is:

1. An integrated circuit, comprising:
   an extended region of P-type monocrystalline semiconductor material;
   a plurality of N-well regions within said extended region, and a plurality of P-channel field-effect transistors formed in ones of said N-well regions;
   a plurality of N-channel field-effect transistors formed in portions of said extended region;
   a power terminal, for connection to a positive external power supply voltage, said power terminal being operatively connected to ones of said N-well regions;
   a battery terminal, for connection to a positive backup power supply voltage, said battery terminal being connected to ones of said N-well regions through a structure which includes:
     a first region which is P-type and which is connected to said battery terminal;
     a second region which is N-type and which is surrounded by said first region, said first and second regions defining a first junction therebetween;
     a third region which is N-type and which surrounds said first region, said first and third regions defining a second junction therebetween, said second junction surrounding said first junction;
     said first and third regions being ohmically connected to each other;
   whereby minority carriers which are injected in the vicinity of said first junction will be collected at said second junction.

2. The integrated circuit of claim 1, wherein said first region includes a shallow heavily doped P-type diffusion, at the surface thereof, which runs substantially parallel to said first junction for the whole length of said first junction.

3. The integrated circuit of claim 1, wherein said third region includes a shallow heavily doped N-type diffusion, at the surface thereof, which runs substantially parallel to said first junction for the whole length of said first junction.

4. The integrated circuit of claim 1, wherein said third region includes a shallow heavily doped N-type diffusion, at the surface thereof, which runs substantially parallel to said second junction for the whole length of said second junction.

5. The integrated circuit of claim 1, wherein said second region is completely enclosed, except for a surface for ohmic contact, by said first region.

6. The integrated circuit of claim 1, wherein said integrated circuit is formed in an epitaxial semiconductor layer on a monocrystalline semiconductor body.

7. The integrated circuit of claim 1, wherein said N-channel transistors are formed within P-well regions which are more heavily doped than said extended region.

8. The integrated circuit of claim 1, wherein said N-channel transistors are formed within said extended region.

9. The integrated circuit of claim 1, wherein said first region is more heavily doped than said third region.

* * * * *